United States Patent
Stahl et al.

(10) Patent No.: US 10,336,610 B2
(45) Date of Patent: Jul. 2, 2019

(54) METHOD FOR PRODUCING A MICROMECHANICAL COMPONENT

(71) Applicant: Robert Bosch GmbH, Stuttgart (DE)

(72) Inventors: Heiko Stahl, Reutlingen (DE); Andreas Scheurle, Leonberg (DE); Hendrik Specht, Pliezhausen (DE); Marlene Winker, Reutlingen (DE); Ralf Hausner, Reutlingen (DE); Volker Schmitz, Pfullingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/791,007

(22) Filed: Oct. 23, 2017

(65) Prior Publication Data
US 2018/0111828 A1    Apr. 26, 2018

(30) Foreign Application Priority Data
Oct. 26, 2016 (DE) .......................... 10 2016 221 055

(51) Int. Cl.
| B81C 3/00 | (2006.01) |
| B81C 1/00 | (2006.01) |
| B81C 99/00 | (2010.01) |
| B81B 7/02 | (2006.01) |

(52) U.S. Cl.
CPC ............... *B81C 3/001* (2013.01); *B81B 7/02* (2013.01); *B81C 1/00269* (2013.01); *B81C 99/0035* (2013.01)

(58) Field of Classification Search
CPC .. B81C 3/001; B81C 1/00269; B81C 99/0035
See application file for complete search history.

(56) References Cited

U.S. PATENT DOCUMENTS

| 2010/0025845 | A1* | 2/2010 | Merz | B81B 7/0038 257/723 |
| 2010/0028618 | A1* | 2/2010 | Gonska | B81B 7/02 428/188 |
| 2011/0209815 | A1* | 9/2011 | Aono | G01C 19/56 156/146 |

(Continued)

*Primary Examiner* — Peniel M Gumedzoe
(74) *Attorney, Agent, or Firm* — Norton Rose Fulbright US LLP; Gerard Messina

(57) ABSTRACT

A method for producing a micromechanical component is provided, In a preparatory step, a substrate device of the micromechanical component and/or a cap device of the micromechanical component is patterned. In a first sub-step, a first pressure and/or a first chemical composition being adjusted, and the substrate device and the cap device being connected to each other so that a first cavern is formed, sealed from an environment of the micromechanical component, the first pressure prevailing in the first cavity and/or the first chemical composition being enclosed. In a second sub-step, a second pressure and/or a second chemical composition being adjusted, and the substrate device and the cap device being connected to each other so that a second cavity is formed, sealed from the environment of the micromechanical component and from the first cavity, the second pressure prevailing in the second cavity and/or the second chemical composition being enclosed.

4 Claims, 4 Drawing Sheets

(56) References Cited

U.S. PATENT DOCUMENTS

| | | | |
|---|---|---|---|
| 2015/0353346 A1* | 12/2015 | Heuck | B81B 7/02 |
| | | | 257/415 |
| 2015/0353347 A1* | 12/2015 | Schelling | B81B 7/0041 |
| | | | 257/414 |
| 2016/0130137 A1* | 5/2016 | Huang | B81B 7/02 |
| | | | 257/415 |
| 2016/0304338 A1* | 10/2016 | Saint-Patrice | B81C 1/00293 |

* cited by examiner

METHOD FOR PRODUCING A MICROMECHANICAL COMPONENT

CROSS REFERENCE

The present application claims the benefit under 35 U.S.C. § 119 of German Patent Application No. DE 102016221055.6 filed on Oct. 26, 2016, which is expressly incorporated herein by reference in its entirety.

BACKGROUND INFORMATION

Conventionally, if a specific internal pressure is desired in a cavity of a micromechanical component or if a gas mixture having a specific chemical composition is to be sealed inside the cavity, then the internal pressure or the chemical composition is frequently adjusted when encapsulating the micromechanical component or during the bonding process between a substrate wafer and a cap wafer. During the encapsulation, a cap is joined to a substrate, for instance, whereby the cap and the substrate jointly enclose the cavity. Adjusting the atmosphere or the pressure and/or the chemical composition of the gas mixture prevailing in the environment during the encapsulation therefore allows for an adjustment of the specific internal pressure and/or the specific chemical composition in the cavity.

Micromechanical components such as inertial sensors are preferably hermetically sealed by a wafer bonding process in order to protect the sensors from environmental influences (dust, moisture, gas) or to selectively enclose certain gases or a vacuum. Examples of methods for the hermetical sealing of micromechanical inertial sensors at the wafer level are eutectic bonding, glass-frit bonding and thermocompression bonding.

Currently, a defined pressure (e.g., a vacuum around 1 mbar, a medium pressure around a few 100 mbar or an overpressure up to 2000 mbar) or a specific gas (e.g., nitrogen or neon) is adjusted. In general, a low internal pressure is adjusted in yaw-rate sensors (high-quality systems) and a high internal pressure is adjusted in the case of acceleration sensors (high damping), which is achieved by an evacuation or by the selective supply of a gas during the wafer-bonding process.

SUMMARY

It is an object of the present invention to provide a method for producing a micromechanical component having a first cavity and a second cavity in a manner that is uncomplicated, resource-sparing and cost-effective in comparison with the related art, and in which a first pressure is able to be adjusted in the first cavity and a second pressure is able to be adjusted in the second cavity.

This objective may be achieved in accordance with the present invention. In one embodiment:
in a second sub-step
a second pressure and/or a second chemical composition is/are adjusted, and
the substrate device and the cap device are connected to each other in such a way that a second cavity is formed, which is sealed, especially hermetically sealed, from the environment of the micromechanical component and from the first cavity, the second pressure prevailing in the second cavity and/or the second chemical composition being enclosed in the second cavity.

Since the substrate device and the cap device are connected to each other in a first sub-step and in a second sub-step, the first cavity being formed in the first sub-step and the second cavity being formed in the second sub-step, it is advantageously possible to first adjust the first pressure in the first cavity in a staggered bonding process, and to then adjust the second pressure in the second cavity within the same bonding process.

Combining the first sub-step with the second sub-step in a staggered process advantageously makes it possible to omit two complete bonding processes and to thereby considerably reduce the process time in comparison with the related art. In addition, it is advantageously possible, in particular due to the combination of the preparatory step with the first sub-step and the second sub-step, to realize a smaller chip measure ("footprint"), and thus to reduce the material costs per micromechanical component and to increase the number of micromechanical components per wafer, meaning that the micromechanical component or the chip including the micromechanical component is able to be produced in a more cost-effective manner.

In particular, the present invention advantageously makes it possible to realize the adjustment of two pressure values at the wafer level in one chip, made up of an acceleration sensor and a yaw rate sensor. Through the use of selectively adjusted topographies and by a combination of mechanisms of wafer-bonding methods, in particular, it is possible to adjust within one process different internal pressures in chips at the wafer level.

As a result, a method is provided for producing a micromechanical component having a first cavity and a second cavity in a manner that is simple, resource-sparing and cost-effective in comparison with the related art, wherein a first pressure is adjustable in the first cavity, and a second pressure is adjustable in the second cavity.

In connection with the present invention, the term "micromechanical component" is to be understood to include both micromechanical components and micro-electromechanical components.

The present invention is preferably provided for the production of a micromechanical component or for a micromechanical component having two cavities. However, the present invention is also provided for a micromechanical component having three cavities or having more than three cavities, such as four, five, six or more cavities, for example.

Advantageous refinements and further developments of the present invention are described herein and are shown in the figures.

According to one preferred further development, the first pressure is higher than the second pressure, and a first sensor unit for an acceleration measurement is situated in the first cavity, and a second sensor unit for a yaw rate measurement is situated in the second cavity. According to one preferred further development, the first pressure is lower than the second pressure, and a first sensor unit for a yaw rate measurement is situated in the first cavity and a second sensor unit for an acceleration measurement is situated in the second cavity. This advantageously provides a mechanically robust micromechanical component for a yaw rate measurement and an acceleration measurement with operating conditions that are optimal both for the first sensor unit and the second sensor unit.

According to one preferred further development, it is provided that the substrate device includes a first substrate frame and a second substrate frame, the first substrate frame and the second substrate frame being developed in such a way that prior to the first sub-step, an extension of the first substrate frame perpendicular to a substrate-main extension plane of the substrate device is greater than an extension of the second substrate frame perpendicular to the substrate main-extension plane. With the aid of the development of the first substrate frame and the second substrate frame in the first sub-step, it is therefore advantageously possible to form the in particular hermetically sealed first cavity and the in particular hermetically sealed second cavity in the second sub-step.

According to one preferred further development, the cap device includes a first cap frame and a second cap frame. The first cap frame and the second cap frame are developed in such a way that, prior to the first sub-step, an extension of the first cap frame perpendicular to a cap main-extension plane of the cap device is greater than an extension of the second cap frame perpendicular to the cap main-extension plane. With the aid of the development of the first cap frame and the second cap frame in the first sub-step, it is therefore advantageously possible to form the in particular hermetically sealed first cavity and the in particular hermetically sealed second cavity in the second sub-step.

According to one preferred further development, the substrate device includes a first substrate frame and a second substrate frame. Prior to the first sub-step, the second substrate frame is patterned in such a way that an access opening between the second cavity and the environment is formed during the first sub-step. This advantageously makes it possible that even at an identical extension of the first substrate frame and the second substrate frame perpendicular to the substrate main-extension plane, the second cavity is not yet sealed, in particular hermetically sealed, with the aid of the patterning of the second substrate frame in the first sub-step, and that the second cavity is able to be sealed, in particular hermetically sealed, in the second sub-step.

According to one preferred further development, the cap device includes a first cap frame and a second cap frame. Prior to the first sub-step, the second cap frame is patterned in such a way that an access opening is formed during the first sub-step between the second cavity and the environment. This advantageously makes it possible that even at an identical extension of the first cap frame and the second cap frame perpendicular to the cap main-extension plane, the second cavity is not yet sealed, in particular hermetically sealed, with the aid of the patterning of the second cap frame in the first sub-step, and that the second cavity is able to be sealed, in particular hermetically sealed, in the second sub-step.

According to one preferred further development, the first sub-step and the second sub-step are executed in a bonding process. In an advantageous manner, this especially makes it possible to dispense with two complete bonding processes.

According to one preferred further development, the substrate device and the cap device are connected to each other in the first sub-step in such a way that the first substrate frame and/or the first cap frame enclose(s) the especially hermetically sealed first cavity. The substrate device and the cap device are connected to each other in the second sub-step in such a way that the second substrate frame and/or the second cap frame enclose(s) the especially hermetically sealed second cavity. This advantageously makes it possible to adjust the first pressure in the first cavity with the aid of the first substrate frame and/or the first cap frame, and to adjust the second pressure in the second cavity with the aid of the second substrate frame and/or the second cap frame.

According to one preferred further development, the substrate device and the cap device are connected to each other in the first sub-step with the aid of thermo-compression bonding. According to a preferred further development, the substrate device and the cap device are connected to each other in the first sub-step by seal-glass bonding. According to one preferred further development, the substrate device and the cap device are connected to each other with the aid of eutectic bonding in the first sub-step. According to one preferred further development, it is provided that the substrate device and the cap device are connected to each other in the second sub-step with the aid of eutectic bonding. According to one preferred further development, the substrate device and the cap device are connected to each other in the second sub-step by seal-glass bonding. This provides advantageous options for integrating different bonding mechanisms into a bonding process.

DETAILED DESCRIPTION OF EXAMPLE EMBODIMENTS

Identical parts in the various figures have always been provided with identical reference signs and are therefore also identified or generally mentioned only once.

Figure 1:
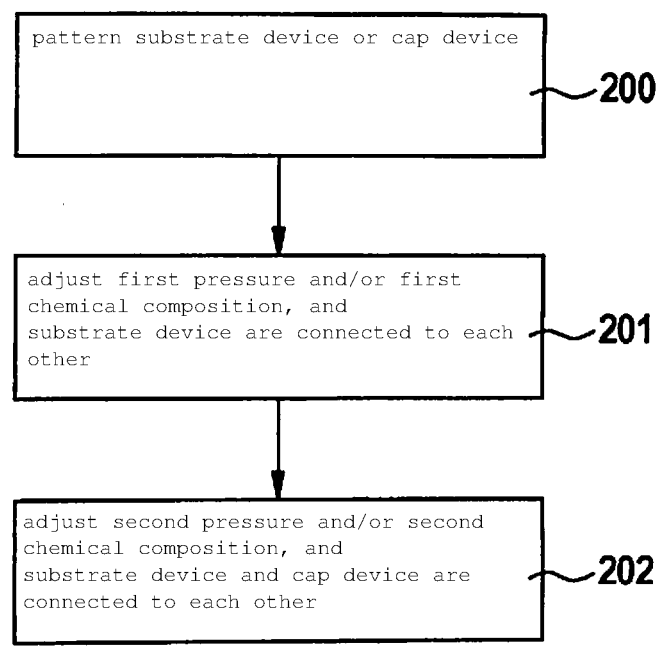
FIG. 1, in a schematic representation, shows a method for producing a micromechanical component according to an exemplary embodiment of the present invention.
Figure 2:
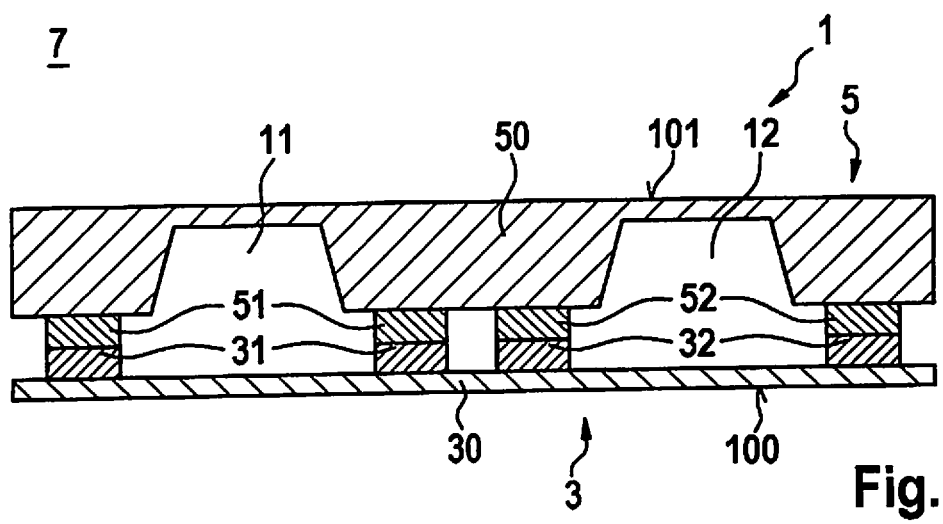
FIG. 2 through FIG. 7, in schematic representations, show micromechanical components during methods according to exemplary specific embodiments of the present invention.

FIG. 1 shows a schematic representation of a method for producing a micromechanical component 1 according to one exemplary specific embodiment of the present invention. In addition, schematic representations of micromechanical components 1 are shown, and in FIG. 2 through FIG. 7 during methods according to exemplary embodiments of the present invention.

According to the present invention, the micromechanical component 1 includes a substrate device 3 and a cap device 5. Substrate device 3 preferably extends along a substrate main-extension plane 100, and cap device 5 extends along a cap main-extension plane 101. In addition, substrate device 3 preferably includes at least a part of a substrate wafer 30, and cap device 5 preferably includes at least a part of a cap wafer 50. Preferably, substrate wafer 30 encompasses a functional wafer. In addition, substrate device 3 preferably includes a first substrate frame 31 and a second substrate frame 32, and cap device 5 preferably includes a first cap frame 51 and a second cap frame 52. Moreover, first substrate frame 31 includes at least a part of a patterned layer situated on substrate wafer 30, and second substrate frame 32 includes at least a further part of the patterned layer situated on substrate wafer 30. In addition, first cap frame 51 encompasses at least a part of a patterned layer situated on cap wafer 50, and second cap frame 52 includes at least a further part of the patterned layer situated on cap wafer 50.

First substrate frame 31 preferably includes aluminum. In addition, second substrate frame 32 preferably includes aluminum. Moreover, first cap frame 51 preferably includes germanium, and second cap frame 52 preferably includes germanium. Especially preferably, first cap frame 51 includes germanium and silicon oxide. In addition, substrate wafer 30 preferably includes a silicon wafer, and/or cap wafer 50 preferably includes a further silicon wafer.

According to the present invention it is furthermore provided that in a preparatory step 200, substrate device 3 and/or cap device 5 is/are patterned. In this context it is preferably provided that by depositing and/or growing and patterning additional layers on the part of substrate wafer 30 and/or on the part of cap wafer 50, and/or on the not yet patterned layers of first substrate frame 31 and/or second substrate frame 32, and/or first cap frame 51 and/or second cap frame 52, the part of substrate wafer 30, and/or the part of cap wafer 50, and/or the respective layers of first substrate frame 31 and/or of second substrate frame 32 and/or of first cap frame 51 and/or second cap frame 52 are patterned, preferably during preparatory step 200. It is furthermore preferably provided that substrate device 3 is patterned with the aid of surface-micromachining. In addition, cap device 5 is preferably patterned using bulk micromachining.

Prior to first sub-step 201, and in particular in preparatory step 200, first substrate frame 31 and second substrate frame 32 are preferably developed in such a way that prior to first sub-step 201, and especially preferably also prior to second sub-step 202, an extension of first substrate frame 31 perpendicular to a substrate main-extension plane 100 of substrate device 3 is greater than an extension of second substrate frame 32 perpendicular to substrate main-extension plane 100. In addition, prior to first sub-step 201, and in particular in preparatory step 200, first cap frame 51 and second cap frame 52 are preferably developed in such a way that prior to first sub-step 201, and especially preferably also prior to second sub-step 202, an extension of first cap frame 51 perpendicular to a cap main-extension plane 101 of cap device 5 is greater than an extension of second cap frame 52 perpendicular to cap main-extension plane 101.

In addition, following preparatory step 200 and prior to first sub-step 201, substrate device 3 and cap device 5 are preferably placed in such a way relative to each other that substrate main-extension plane 100 and cap main-extension plane 101 are situated parallel to each other. It is preferably provided here that substrate device 3 and cap device 5 are placed in such a way relative to each other that first substrate frame 31 and second substrate frame 32 are facing cap device 5. In addition, substrate device 3 and cap device 5 are preferably placed in such a way relative to each other that first cap frame 51 and second cap frame 52 are facing substrate device 3.

According to the present invention, it is furthermore provided that
in a first sub-step 201, which is preferably carried out following preparatory step 200,
a first pressure and/or a first chemical composition is/are adjusted, and
substrate device 3 and cap device 5 are connected to each other in such a way that a first cavity 11 is formed, which is sealed, especially hermetically sealed, from an environment 7 of micromechanical component 1, the first pressure prevailing in first cavity 11, and/or the first chemical composition being enclosed. Preferably, the first chemical composition includes nitrogen. In addition, the first chemical composition preferably includes a volume share of nitrogen of at least 90%, and especially preferably of at least 99%, and most preferably, at least 99.9%. Moreover, the first chemical composition preferably includes neon. In addition, the first chemical composition preferably includes a volume share of neon of at least 90%, and especially preferably of at least 99%, and most preferably, at least 99.9%.

It is preferably provided that, preferably especially prior to adjusting the first pressure and/or the first chemical composition, substrate device 3 and cap device 5 are set apart from each other. In addition, substrate device 3 and cap device 5 are preferably placed in such a way relative to each other that an overlap comes about between a projection of first substrate frame 31 onto substrate main-extension plane 100 and a projection of first cap frame 51 onto substrate main-extension plane 100. In addition, substrate device 3 and cap device 5 are preferably situated relative to each other in such a way that an overlap comes about between a projection of second substrate frame 32 onto substrate main-extension plane 100 and a projection of second cap frame 52 onto substrate main-extension plane 100. Substrate devices 3 and cap devices 5 disposed in this way are illustrated by exemplary embodiments shown in FIG. 3 through FIG. 6 by way of example.

Once substrate devices 3 and cap devices 5 have been arranged as illustrated in FIG. 3 through FIG. 6, for example, the first pressure and/or the first chemical composition is/are adjusted. The first pressure and/or the first chemical composition is/are preferably adjusted in environment 7, and therefore spatially prevail also between substrate device 3 and cap device 5, and especially in the still unsealed, especially not hermetically sealed, first cavity 11, and in the still unsealed, especially not hermetically sealed, second cavity 12.

According to the present invention, the distance between substrate main-extension plane 100 and cap main-extension plane 101 or the distance between substrate device 3 and cap device 5 is reduced in a movement step, especially preferably during and/or after an adjustment of the first pressure and/or the first chemical composition. In other words, substrate device 3 is moved perpendicular to substrate main-extension plane 100 and in the direction of cap device 5, and/or cap device 5 is moved perpendicular to cap main-extension plane 101 and in the direction of substrate device 3.

Figure 3:
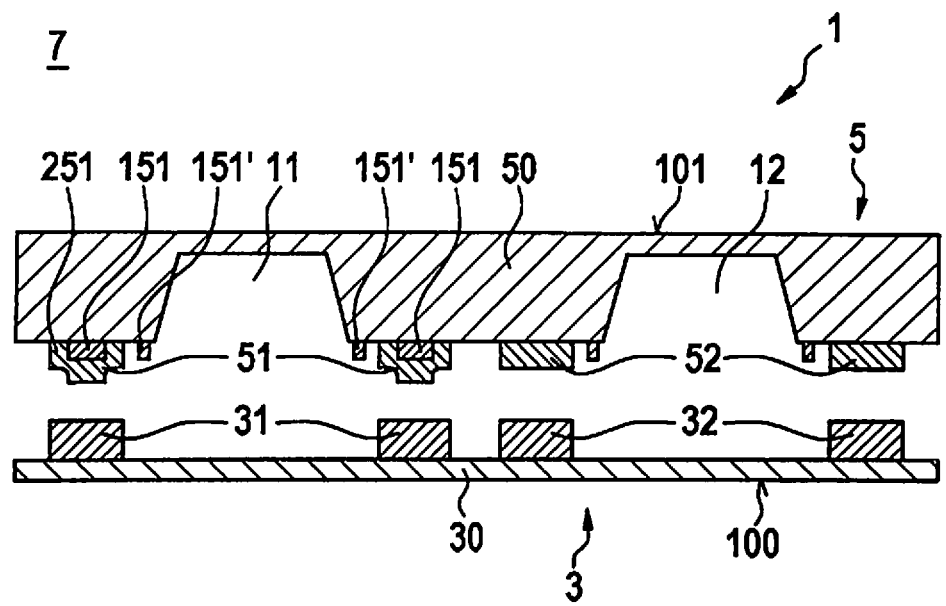
Figure 4:
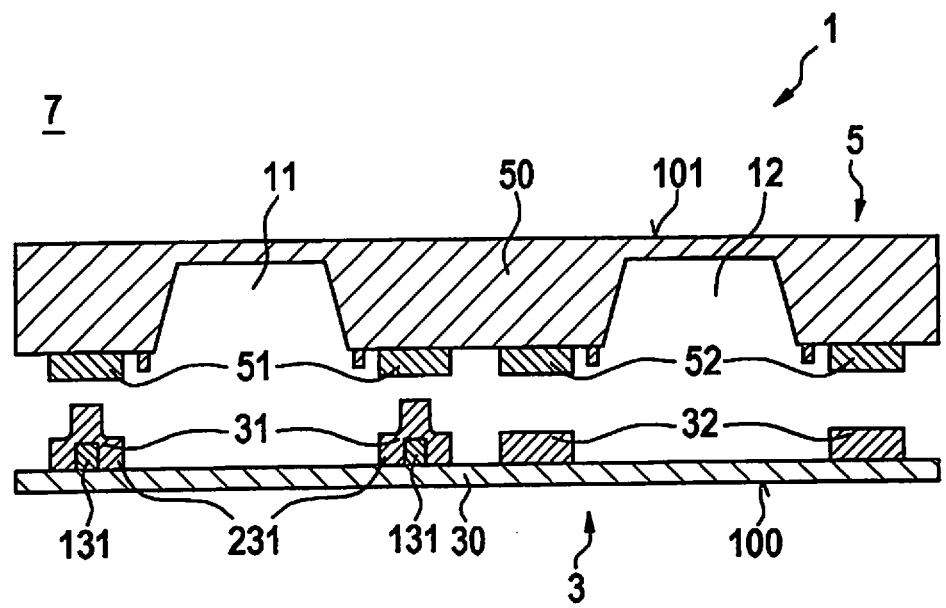
Figure 6:
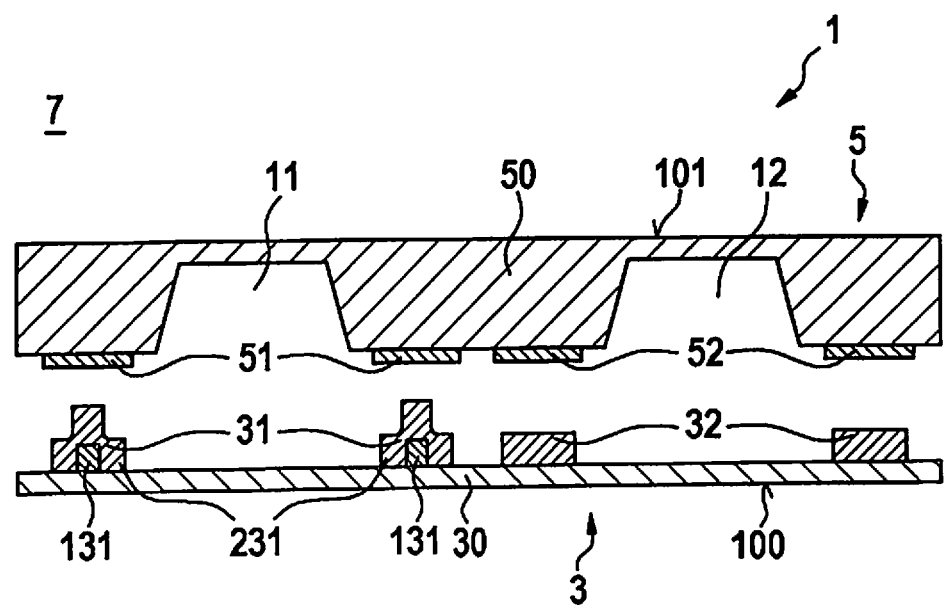

In the exemplary embodiments shown by way of example in FIG. 3, FIG. 4, and FIG. 6, contact is preferably first made between first substrate frame 31 and first cap frame 51 by the execution of the movement step. In the exemplary embodiment shown in FIG. 7 by way of example, preferably both first substrate frame 31 and first cap frame 51 as well as second substrate frame 32 and second cap frame 52 make contact by executing the movement step.

In addition, prior to first sub-step 201, and especially in preparatory step 200, second substrate frame 32 is patterned or developed in such a way that during first sub-step 201, an access opening 40 is formed especially between not yet hermetically sealed second cavity 12 and environment 7.

Moreover, prior to first sub-step 201, and especially in preparatory step 200, second cap frame 52 is patterned or developed in such a way that during first sub-step 201, an access opening or a further access opening is formed between the especially not yet sealed, and in particular not yet hermetically sealed, second cavity 12 and environment 7. In other words, following first sub-step 201 and prior to second sub-step 202, micromechanical component 1 includes a first cavity 11 that is sealed, especially hermetically sealed, from environment 7, and a second cavity 12 that is not sealed, and especially not hermetically sealed, from environment 7.

In addition, according to the present invention it is provided that
in a second sub-step 202, which is preferably executed following first sub-step 201, a second pressure and/or a second chemical composition is/are adjusted, and substrate device 3 and cap device 5 are connected to each other in such a way that a second cavity 12 is formed, which is sealed, and especially hermetically sealed, from environment 7 of micromechanical component 1 and from first cavity 11, the second pressure prevailing in second cavity 12, and/or the second chemical composition being enclosed in second cavity 12.

Preferably, the second pressure and/or the second chemical composition is/are adjusted in environment 7 and thus spatially prevail(s) also between substrate device 3 and cap device 5, in particular in not yet sealed, and especially not yet hermetically sealed, second cavity 12.

According to the present invention, the distance between substrate main-extension plane 100 and cap main-extension plane 101 is further reduced in a further movement step, especially preferably while and/or after an adjustment of the second pressure and/or the second chemical composition. In other words, substrate device 3 is moved perpendicular to substrate main-extension plane 100 and in the direction of cap device 5, and/or cap device 5 is moved perpendicular to substrate main-extension plane 100 and in the direction of substrate device 3. In the process, substrate device 3 and cap device 5 are preferably moved in such a way that substrate main-extension plane 100 and cap main-extension plane 101 are situated parallel to each other, preferably at all times. In the exemplary embodiments shown in FIG. 3, FIG. 4, FIG. 6 and FIG. 7 by way of example, first substrate frame 31 and/or first cap frame 51 is/are plastically deformed, preferably with the aid of mechanical pressure and/or temperature, and/or transferred into a liquid state of aggregation. In the exemplary embodiment shown in FIG. 7 by way of example, preferably both first substrate frame 31 and/or first cap frame 51 as well as second substrate frame 32 and/or second cap frame 52 is/are plastically deformed, preferably with the aid of mechanical pressure and/or temperature, and/or transferred into a liquid state of aggregation.

In the exemplary embodiments shown in FIG. 3, FIG. 4 and FIG. 6 by way of example, second substrate frame 32 and second cap frame 52 preferably make contact by executing the further movement step.

According to the present invention, it is preferably provided that during the further movement step, first cavity 11 remains sealed, in particular hermetically sealed, from environment 7 of micromechanical component 1. In addition, the volume of first cavity 11 is reduced during second sub-step 202, preferably by maximally 10%, and especially preferably, by maximally 1%, and most preferably by maximally 0.1%. Furthermore, following second sub-step 202, the first pressure is preferably maximally 10% higher and especially preferably maximally 1% higher, and most preferably, maximally 0.1% higher than the first pressure prior to second sub-step 202. Moreover, the first chemical composition preferably remains essentially constant during second sub-step 202.

In addition, in first sub-step 201, substrate device 3 and cap device 5 are preferably connected to each other in such a way that first substrate frame 31 and/or first cap frame 51 enclose(s) first cavity 11, which is sealed, and especially hermetically sealed. In second sub-step 202, substrate device 3 and cap device 5 are connected to each other in such a way that second substrate frame 32 and/or second cap frame 52 enclose(s) second cavity 12, which is sealed, and especially hermetically sealed.

According to the present invention, it is preferably provided that substrate device 3 and cap device 5 are connected to each other by bonding in first sub-step 201 and in second sub-step 202. In addition, substrate device 3 and cap device 5 are connected to each other, preferably by thermo-compression bonding, in first sub-step 201. Moreover, in first sub-step 201, substrate device 3 and cap device 5 are connected to each other preferably by seal-glass bonding, and in first sub-step 201, substrate device 3 and cap device 5 are connected to each other preferably with the aid of eutectic bonding. Furthermore, in second sub-step 202, substrate device 3 and cap device 5 are preferably connected to each other by eutectic bonding, and in second sub-step 202, substrate device 3 and cap device 5 are connected to each other preferably by seal-glass bonding.

In addition, second sub-step 202 is preferably carried out in such a way that, following second sub-step 202, an extension of first substrate frame 31 perpendicular to substrate main-extension plane 100 of substrate device 3 essentially equals an extension of second substrate frame 32 perpendicular to substrate main-extension plane 100. Furthermore, second sub-step 202 is preferably carried out in such a way that an extension of first cap frame 51 perpendicular to a cap main-extension plane 101 of cap device 5 equals an extension of second cap frame 52 perpendicular to cap main-extension plane 101. Moreover, second sub-step 202 is preferably performed in such a way that, following second sub-step 202, an extension of first substrate frame 31 and of first cap frame 51 perpendicular to substrate main-extension plane 100 essentially equals an extension of second substrate frame 32 and second cap frame 52 perpendicular to substrate main-extension plane 100.

Figure 5:
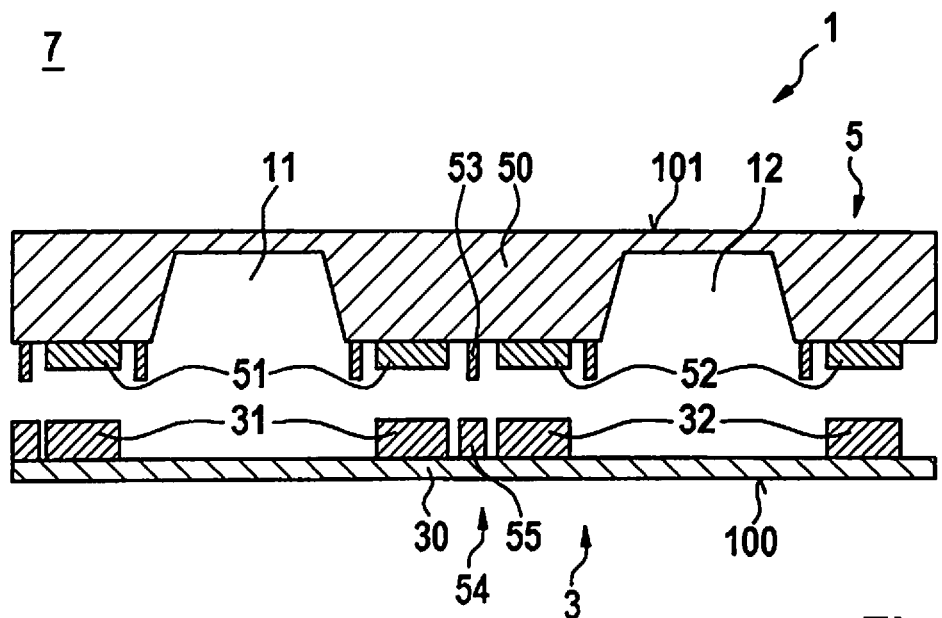

In FIGS. 3 through 5, substrate device 3 and cap device 5 are connected to each other in first sub-step 201 preferably by thermo-compression, and by eutectic bonding in second sub-step 202.

In the exemplary embodiment shown in FIG. 3, a bonding frame topography having an oxide frame 151, and preferably a silicon-oxide frame, is produced under germanium 251 prior to first sub-step 201, and preferably in preparatory step 200. In other words, first cap frame 51 includes an oxide frame 151, oxide frame 151 preferably including silicon oxide, and a germanium frame 251 or a germanium bonding frame 251. In preparatory step 200, oxide frame 151 is preferably first deposited or grown and patterned on the especially preferably pre-patterned part of cap wafer 50, and then germanium frame 251 is deposited on oxide frame 151. As shown in FIG. 3 by way of example, the chips that are meant to seal in the first pressure or that enclose first cavity 11 following first sub-step 201 and following second sub-step 202, are surrounded by one (or multiple) narrow frame(s) 151, 151' of silicon oxide on the cap side, preferably in a plane parallel to substrate main-extension plane 100. The one (or the multiple) narrow frame(s) 151, 151' of silicon oxide lie(s) under the germanium of the bonding frame, or germanium bonding frame 251, and cause(s) an increase in height of the bonding frame or germanium bonding frame 251. In the first part of the bonding process or in first sub-step 201, these chips are sealed by a thermo-compression bond at the first pressure and at a temperature below the eutectic temperature. On the other hand, the bonding frame of the particular chips that are meant to seal in the second pressure or that enclose second cavity 12 have no increased height in the bonding frame, so that they are still open after the first chip has been sealed or after first sub-step 201. They are sealed at the second pressure only in the second part of the bonding process, or in second sub-step 202, following a pressure change in environment 7 or in a bonding chamber. The second sealing takes place above the eutectic temperature, so that all chips—including also the ones sealed first—are eutectically bonded. In an especially preferred manner, especially preferably nitrogen under higher pressure is first sealed in with the aid of a raised topography by oxide frame 151 under germanium frame 251 of an acceleration sensor using a thermo-compression bond, preferably in first sub-step 201. Then, in a continuation of the bonding process under a vacuum, the yaw rate sensor is eutectically bonded, preferably in second sub-step 202, the acceleration sensor also eutectically reacting completely.

In addition, in the exemplary embodiment shown in FIG. 4 by way of example, a bonding frame topography with an aluminum reinforcement is produced prior to first sub-step 201, and preferably in preparatory step 200. The principle of the exemplary embodiment shown in FIG. 4 by way of example preferably corresponds essentially to the principle of the exemplary embodiment shown in FIG. 3 by way of example. In the exemplary embodiment shown in FIG. 4 by way of example, the sensor-side aluminum bonding frame has a greater height as the result of a narrow frame, which is likewise made of aluminum and lies under the bonding frame or under the aluminum bonding frame. In other words, preferably prior to first sub-step 201, a first aluminum layer is deposited and patterned on substrate wafer 30 in such a way that a first aluminum frame 131 is formed on substrate wafer 30, whereupon a second aluminum layer is deposited and patterned on substrate wafer 30 and on patterned first aluminum layer or on first aluminum frame 131, in such a way that a second aluminum frame 231 is formed on substrate wafer 30 and on first aluminum frame 131. In other words, first substrate frame 31 shown in FIG. 4 by way of example includes first aluminum frame 131 and second aluminum frame 231. The chips with raised bonding frames, or first cavity 11, is/are sealed at the first pressure before a pressure change takes place in the bonding chamber or in environment 7, preferably from the first pressure to the second pressure, and the remaining chips with bonding frames without the increased height are sealed at the second pressure, or second cavity 12 is sealed at the second pressure.

In addition, in the exemplary embodiment shown in FIG. 5 by way of example, a sealing lip is formed in the scribe alley prior to first sub-step 201 and preferably in preparatory step 200. In this context, it is preferably provided that substrate device 3 and/or cap device 5 is/are patterned in such a way that the chips that are sealed first or the chips that include first cavern 11 are surrounded by a sealing lip 53 that lies in scribe alley 54. In other words, substrate device 3 and/or cap device 5 is/are preferably patterned in such a way that substrate device 3 and/or cap device 5 include(s) a sealing lip 53, sealing lip 53 preferably being situated between first cavity 11 and second cavity 12. Moreover, on the sensor side, scribe alley 54 is filled with aluminum around the bonding frame, and with a silicon oxide structure on the cap side. Sealing lip 53 preferably includes silicon oxide or a silicon-oxide structure or a scribe-alley oxide. In addition, substrate device 3 is preferably patterned in such a way that substrate device 3 includes a structure 55 inside scribe alley 54, structure 55 preferably including aluminum or scribe-alley aluminum. During bonding, or in first sub-step 201, the chips or first cavity 11 are sealed by the sealing lip in that sealing lip 53 is pressed into structure 55 and the first pressure is sealed inside first cavity 11. After a pressure change, or after an adjustment of the second pressure and/or the second chemical composition, the remaining chips are sealed at the second pressure, or second cavity 12 is sealed at the second pressure, and all chips or first cavity 11 and second cavity 12 are sealed, in particular hermetically sealed, by a eutectic bond, preferably in second sub-step 202.

In the exemplary embodiment shown in FIG. 6 by way of example, a topography is produced in the aluminum bonding frame prior to first sub-step 201 and preferably in preparatory step 200. In other words, preferably prior to first sub-step 201, a first aluminum layer is deposited and patterned on substrate wafer 30 in such a way that a first aluminum frame 131 is formed on substrate wafer 30. Thereafter, a second aluminum layer is deposited and patterned on substrate wafer 30 and on the patterned first aluminum layer or first aluminum frame 131 in such a way that a second aluminum frame 231 is formed on substrate wafer 30 and on first aluminum frame 131. Preferably prior to first sub-step 201, an aluminum frame is applied on the sensor side or on the substrate wafer, which preferably encloses micromechanical structures that are disposed on substrate wafer 30 and in first cavity 11, preferably in a plane that extends parallel to substrate main-extension plane 100, and lies across from a cap-side seal-glass bonding frame or first cap frame 51 and second cap frame 52. First cap frame 51 and second cap frame 52 preferably include a separate seal-glass bonding frame in each case. In the chips that are to be sealed first at the first pressure or that enclose first cavity 11, first substrate frame 31, which preferably includes an aluminum frame, is raised in height in contrast to second substrate frame 32. This variant is seal-glass-bonded in a two-step process. In other words, substrate device 3 and cap device 5 are connected to each other in first sub-step 201 and in second sub-step 202 with the aid of seal-glass bonding. In the process, first cap frame 51 including seal glass and second cap frame 52 including seal glass are preferably softened to begin with. Then, first cap frame 51 meets first substrate frame 31, preferably in or at the end of the movement step. In so doing, the chips or first cavity 11 seal(s) in the first pressure. After a pressure change or after an adjustment of the second pressure and/or the second chemical composition, the contact pressure between substrate device 3 and cap device 5 is increased, so that the remaining chips without raised aluminum frames are bonded at the second pressure or second cavity 12 is sealed, in particular hermetically sealed, from environment 7 and from first cavity 11.

Figure 7:
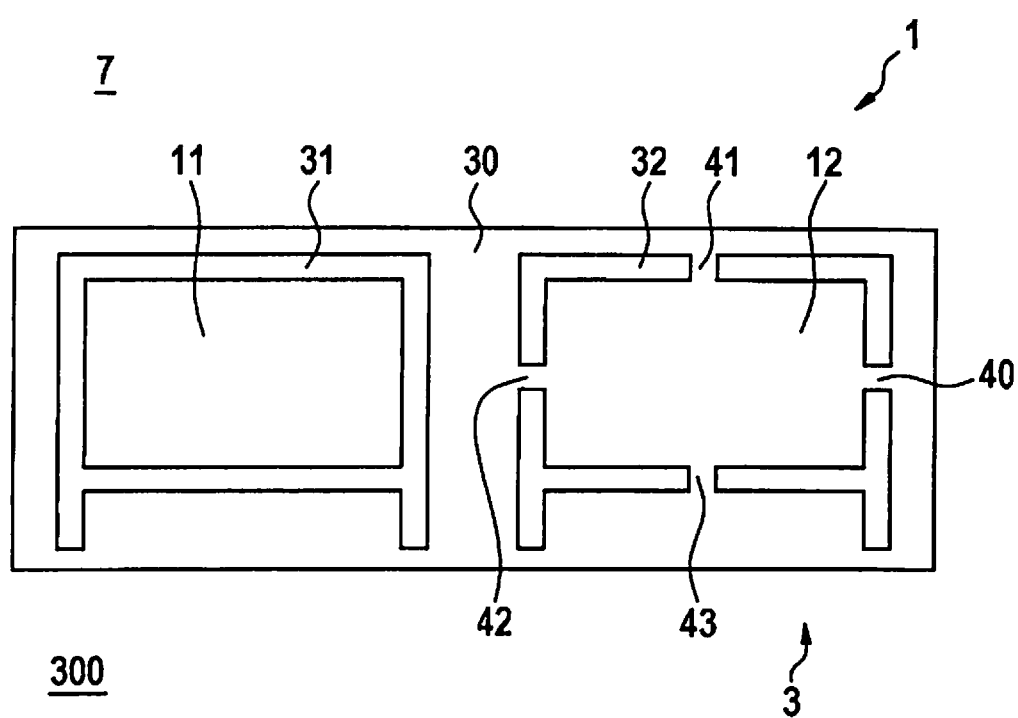

In addition, in the exemplary embodiment shown in FIG. 7 by way of example, eutectic bonding with or without open regions in the Al bonding frame or in first substrate frame 31 and in second substrate frame 32 is performed. Here, preferably prior to first sub-step 201, and especially preferably in preparatory step 200, a first substrate frame 31 is formed, first substrate frame 31 extending in a plane 300 running parallel to substrate main-extension plane 100 and fully enclosing first cavity 11. In addition, preferably prior to sub-step 201 and especially preferably, in preparatory step 200, a second substrate frame 32 is formed in a plane 300 that extends parallel to substrate main-extension plane 100 and only partially encloses second cavity 12.

Here, it is preferably provided that the chips that are meant to seal in the first pressure or that include first cavity 11, have standard bonding frames. The particular chips that are to be sealed at the second pressure only in the second step of the bonding process or that enclose second cavity 12, are provided with gaps in the sensor-side aluminum bonding frame. In other words, second substrate frame 32 includes gaps or recesses 40, 41, 42, 43. Gaps or recesses 40, 41, 42, 43 do not close right away during the bonding or in first sub-step 201, meaning that a pressure change is able to be induced during the bonding process or in second sub-step 202, or that the second pressure and/or the second chemical composition is/are adjusted after the chips with standard bonding frames were already sealed at the first pressure or after a first cavity 11 was formed that is sealed, in particular hermetically sealed, from an environment 7 of micromechanical component 1, but before the gaps or recesses 40, 41, 42, 43 of the remaining chips or of second substrate frame 32 are filled with spreading eutectic material. In this way, the chips that include gaps seal in the second pressure, or substrate device 3 and cap device 5 are connected to each other in such a way that a second cavity 12 is formed which is sealed, in particular hermetically sealed, from environment 7 of micromechanical component 1 and from first cavity 11. The second pressure prevails inside second cavity 12 and/or the second chemical composition is sealed in second cavity 12.

What is claimed is:

1. A method for producing a micromechanical component, the micromechanical component including a substrate device and a cap device, the method comprising:
   in a preparatory step, pattering at least one of the substrate device and the cap device;
   in a first sub-step, adjusting at least one of a first pressure and a first chemical composition, and connecting the substrate device and the cap device to each other in such a way that a first cavity is formed, which is sealed from an environment of the micromechanical component, at least one of the first pressure prevailing in the first cavity and the first chemical composition being enclosed;
   in a second sub-step, adjusting at least one of a second pressure and a second chemical composition, connecting the substrate device and the cap device to each other in such a way that a second cavity is formed, which is sealed from the environment of the micromechanical component and from the first cavity, at least one of the second pressure prevailing in the second cavity and the second chemical composition being enclosed,
   wherein the substrate device includes a first substrate frame and a second substrate frame, the first substrate frame and the second substrate frame are developed in such a way that prior to the first sub-step, an extension of the first substrate frame perpendicular to a substrate main-extension plane of the substrate device is greater than an extension of the second substrate frame perpendicular to the substrate main-extension plane.

2. A method for producing a micromechanical component, the micromechanical component including a substrate device and a cap device, the method comprising:
   in a preparatory step, pattering at least one of the substrate device and the cap device;
   in a first sub-step, adjusting at least one of a first pressure and a first chemical composition, and connecting the substrate device and the cap device to each other in such a way that a first cavity is formed, which is sealed from an environment of the micromechanical component, at least one of the first pressure prevailing in the first cavity and the first chemical composition being enclosed;
   in a second sub-step, adjusting at least one of a second pressure and a second chemical composition, connecting the substrate device and the cap device to each other in such a way that a second cavity is formed, which is sealed from the environment of the micromechanical component and from the first cavity, at least one of the second pressure prevailing in the second cavity and the second chemical composition being enclosed,
   wherein the cap device includes a first cap frame and a second cap frame, the first cap frame and the second cap frame being developed in such a way that prior to the first sub-step, an extension of the first cap frame perpendicular to a cap main-extension plane of the cap device is greater than an extension of the second cap frame perpendicular to the cap main-extension plane.

3. A method for producing a micromechanical component, the micromechanical component including a substrate device and a cap device, the method comprising:
   in a preparatory step, pattering at least one of the substrate device and the cap device;
   in a first sub-step, adjusting at least one of a first pressure and a first chemical composition, and connecting the substrate device and the cap device to each other in such a way that a first cavity is formed, which is sealed from an environment of the micromechanical component, at least one of the first pressure prevailing in the first cavity and the first chemical composition being enclosed;
   in a second sub-step, adjusting at least one of a second pressure and a second chemical composition, connecting the substrate device and the cap device to each other in such a way that a second cavity is formed, which is sealed from the environment of the micromechanical component and from the first cavity, at least one of the second pressure prevailing in the second cavity and the second chemical composition being enclosed,
   wherein the substrate device includes a first substrate frame and a second substrate frame, and prior to the first sub-step, the second substrate frame is patterned in such a way that an access opening is formed during the first sub-step between the second cavity and the environment.

4. A method for producing a micromechanical component, the micromechanical component including a substrate device and a cap device, the method comprising:
   in a preparatory step, pattering at least one of the substrate device and the cap device;
   in a first sub-step, adjusting at least one of a first pressure and a first chemical composition, and connecting the substrate device and the cap device to each other in such a way that a first cavity is formed, which is sealed from an environment of the micromechanical component, at least one of the first pressure prevailing in the first cavity and the first chemical composition being enclosed;
   in a second sub-step, adjusting at least one of a second pressure and a second chemical composition, connecting the substrate device and the cap device to each other in such a way that a second cavity is formed, which is sealed from the environment of the micromechanical component and from the first cavity, at least one of the second pressure prevailing in the second cavity and the second chemical composition being enclosed,
   wherein the cap device includes a first cap frame and a second cap frame, and prior to the first sub-step, the second cap frame is patterned in such a way that an access opening is formed during the first sub-step between the second cavity and the environment.

* * * * *